United States Patent
Ellis-Monaghan et al.

(10) Patent No.: US 6,949,796 B1
(45) Date of Patent: Sep. 27, 2005

(54) HALO IMPLANT IN SEMICONDUCTOR STRUCTURES

(75) Inventors: John J. Ellis-Monaghan, Grand Isle, VT (US); Kirk D. Peterson, Jericho, VT (US); Jeffrey S. Zimmerman, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/711,484

(22) Filed: Sep. 21, 2004

(51) Int. Cl.[7] .......................................... H01L 29/76
(52) U.S. Cl. ....................... 257/335; 257/347; 257/344; 257/316; 257/324; 438/286; 438/524; 438/302; 438/217; 438/162; 438/289
(58) Field of Search ................................ 438/217, 163, 438/162, 276, 289, 519, 527, 286, 524, 302; 257/335, 347, 344, 316, 324

(56) References Cited

U.S. PATENT DOCUMENTS

| | | | |
|---|---|---|---|
| 5,217,913 A | 6/1993 | Watabe et al. | |
| 5,426,063 A | 6/1995 | Kaneko et al. | |
| 5,698,869 A | 12/1997 | Yoshimi et al. | |
| 5,716,862 A | 2/1998 | Ahmad et al. | |
| 5,759,901 A | 6/1998 | Loh et al. | |
| 5,858,831 A | 1/1999 | Sung | |
| 5,891,792 A | 4/1999 | Shih et al. | |
| 6,194,278 B1 * | 2/2001 | Rengarajan | 438/302 |
| 6,355,512 B1 | 3/2002 | Yamazaki et al. | |
| 6,444,548 B2 | 9/2002 | Divakaruni et al. | |
| 6,489,223 B1 | 12/2002 | Hook et al. | |
| 6,566,204 B1 * | 5/2003 | Wang et al. | 438/286 |
| 6,794,718 B2 * | 9/2004 | Nowak et al. | 257/347 |
| 6,846,708 B2 * | 1/2005 | Feudel et al. | 438/162 |

* cited by examiner

Primary Examiner—Nathan J. Flynn
Assistant Examiner—Remmon R. Fordé
(74) Attorney, Agent, or Firm—Schmeiser, Olsen & Watts; William D. Sabo

(57) ABSTRACT

A halo implant method for forming halo regions of at least first and second transistors formed on a same semiconductor substrate. The first transistor comprises a first gate region disposed between first and second semiconductor regions. The second transistor comprises a second gate region disposed between third and fourth semiconductor regions. The method comprises the steps of, in turn, halo-implanting each of the first, second, third, and fourth semiconductor regions, with the other three semiconductor regions being masked, in a projected direction which (i) is essentially perpendicular to the direction of the respective gate region and (ii) points from the halo-implanted semiconductor region to the respective gate region.

20 Claims, 7 Drawing Sheets

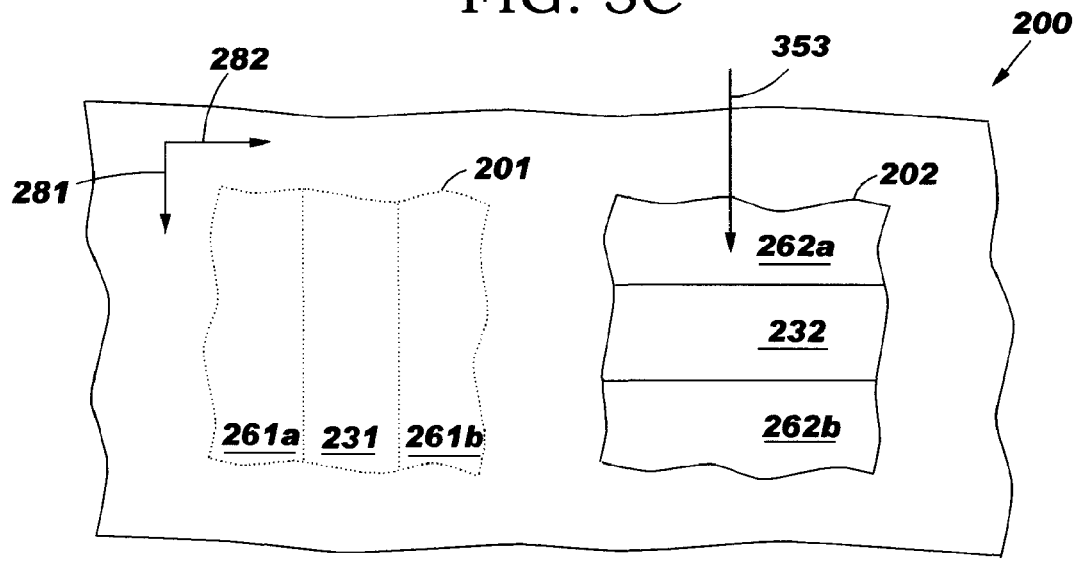
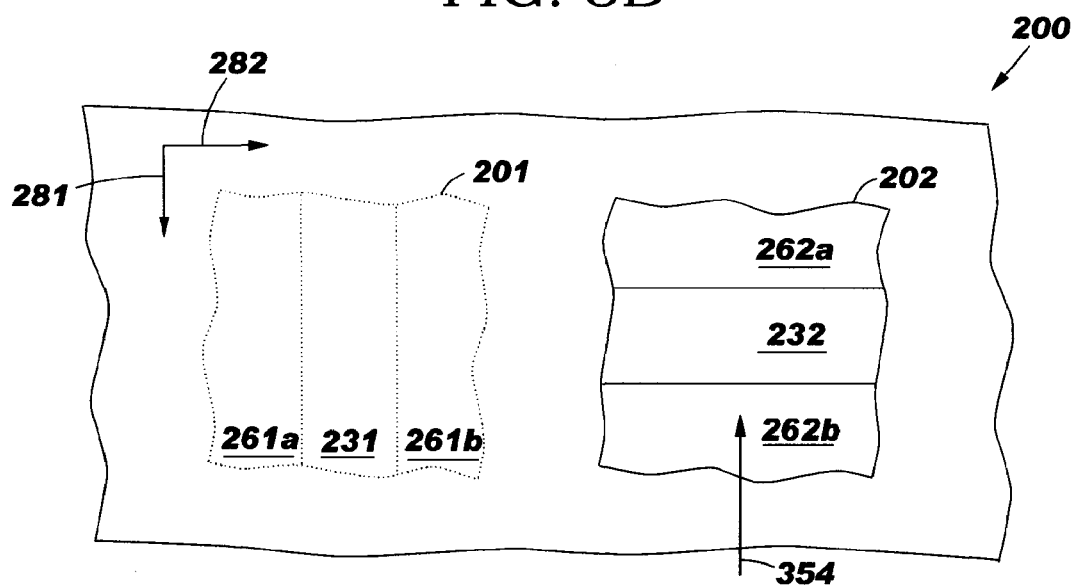

US 6,949,796 B1

HALO IMPLANT IN SEMICONDUCTOR STRUCTURES

BACKGROUND OF THE INVENTION

1. Technical Field

The present invention relates to performance improvements of semiconductor transistors, and more particularly, to the use of halo implants to improve performance of semiconductor transistors.

2. Related Art

In the fabrication process of a typical semiconductor transistor, halo implant is a fabrication step which involves the doping of regions beneath the lightly-doped source/drain (S/D) extension regions of the transistor so as to form halo regions. For each of such halo regions, only the portion under the gate region (called undercutting portion) is useful, and therefore desirable, whereas the rest of the halo region has the effect of reducing the doping concentration of the respective S/D region (called the S/D doping reduction effect), which is undesirable.

Therefore, there is a need for a novel method for forming a halo region that minimizes the S/D doping reduction effect.

SUMMARY OF THE INVENTION

The present invention provides a halo implant method, comprising the steps of (a) providing first and second semiconductor structures formed on a same semiconductor substrate, wherein the first semiconductor structure comprises a first gate region, a first channel region, and first and second semiconductor regions, wherein the first gate region is on top of the first channel region and is oriented in a first direction, wherein the first channel region is sandwiched between the first and second semiconductor regions, wherein the second semiconductor structure comprises a second gate region, a second channel region, and third and fourth semiconductor regions, wherein the second gate region is on top of the second channel region and is oriented in a second direction, wherein the second channel region is sandwiched between the third and fourth semiconductor regions, and wherein the first and second channel regions are of a same channel polarity, wherein the first and second directions are essentially parallel to a top surface of the semiconductor substrate and are not parallel to each other; and (b) halo-implanting the first, second, third, and fourth semiconductor regions in a third projected direction, wherein the third projected direction is essentially a bisector direction of the first and second directions.

The present invention also provides a halo implant method, comprising the steps of (a) providing first and second semiconductor structures formed on a same semiconductor substrate, wherein the first semiconductor structure comprises a first gate region, a first channel region, and first and second semiconductor regions, wherein the first gate region is on top of the first channel region and is oriented in a first direction, wherein the first channel region is sandwiched between the first and second semiconductor regions, wherein the second semiconductor structure comprises a second gate region, a second channel region, and third and fourth semiconductor regions, wherein the second gate region is on top of the second channel region and is oriented in a second direction, wherein the second channel region is sandwiched between the third and fourth semiconductor regions, wherein the first and second channel regions are of a same channel polarity, wherein the first and second directions are essentially parallel to a top surface of the semiconductor substrate; and (b) if the first and second directions are not essentially parallel to each other, halo-implanting the first semiconductor region, but not the third and fourth semiconductor regions, in a third projected direction, wherein the third projected direction is essentially perpendicular to the first direction and going from the first semiconductor region toward the first gate region; and (c) if the first and second directions are essentially parallel to each other, halo-implanting the first and third semiconductor regions, but not the second and fourth semiconductor regions, in a fourth projected direction, wherein the fourth projected direction is essentially perpendicular to the first direction and going from the first semiconductor region toward the first gate region.

The present invention also provides a semiconductor structure, comprising (a) first and second semiconductor structures formed on a same semiconductor substrate, wherein the first semiconductor structure comprises a first gate region, a first channel region, and first and second semiconductor regions, wherein the first gate region is on top of the first channel region and is oriented in a first direction, wherein the first channel region is sandwiched between the first and second semiconductor regions, wherein the second semiconductor structure comprises a second gate region, a second channel region, and third and fourth semiconductor regions, wherein the second gate region is on top of the second channel region and is oriented in a second direction, wherein the second channel region is sandwiched between the third and fourth semiconductor regions, wherein the first and second channel regions are of a same channel polarity, wherein the first and second directions are essentially parallel to a top surface of the semiconductor substrate and are not parallel to each other; and (b) a halo ion beam having a projected direction which is essentially a bisector direction of the first and second directions.

The present invention provides a novel method for forming the halo regions that minimizes the S/D doping reduction effect.

BRIEF DESCRIPTION OF THE DRAWINGS

FIGS. 3A–3D show top views of the semiconductor structure of FIGS. 2A–2B used to illustrate a third halo implant method, in accordance with embodiments of the present invention.

DETAILED DESCRIPTION OF THE INVENTION

Figure 1A:
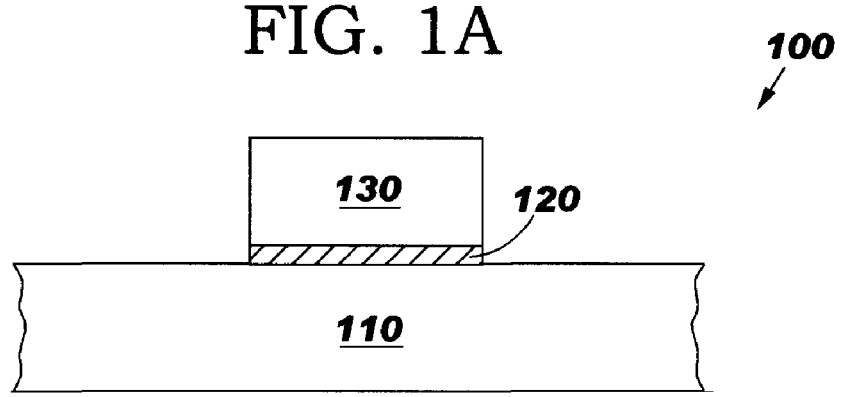
FIGS. 1A–1E show cross-sectional views of a semiconductor structure used to illustrate a first halo implant method, in accordance with embodiments of the present invention.

FIGS. 1A–1E show cross-sectional views of a semiconductor structure 100 used to illustrate a first halo implant method, in accordance with embodiments of the present invention. More specifically, with reference to FIG. 1A, in one embodiment, the fabrication process of the structure 100 starts out with the formation of a gate stack 120,130 (comprising a gate region 130 on a gate dielectric layer 120) on top of a semiconductor (silicon, germanium, etc.) substrate 110. The gate region 130 is electrically isolated from the substrate 110 by the gate dielectric layer 120.

Figure 1B:
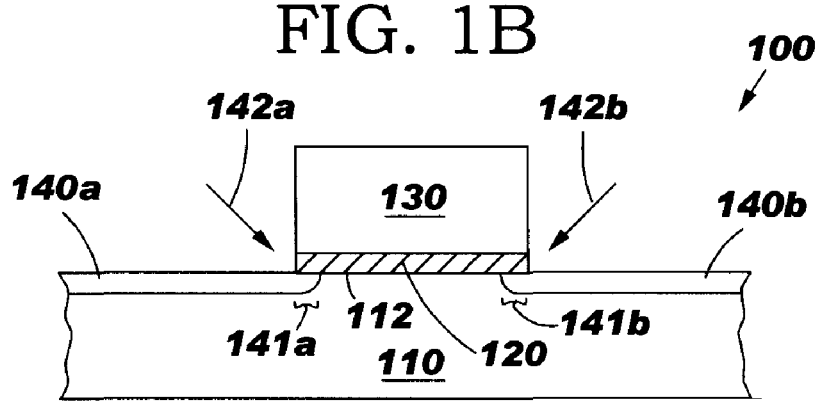

Next, with reference to FIG. 1B, in one embodiment, source/drain (S/D) extension regions 140a and 140b are formed in and at top surface of the substrate 110. In one embodiment, thin gate spacers (not shown) can be formed on side walls of the gate stack 120,130 by, illustratively, thermal oxidation before the formation of the S/D extension regions 140a and 140b. The S/D extension regions 140a and 140b can be lightly doped. Assume that the structure 100 is a transistor with an n-type channel. As a result, S/D extension regions 140a and 140b should be lightly doped with n-type dopants such as Arsenic atoms. In one embodiment, the S/D extension regions 140a and 140b can be formed by ion implantation with a low-energy ion beam of Arsenic ions.

In one embodiment, the S/D extension regions 140a and 140b extend under (i.e., undercut) the gate region 130. More specifically, the S/D extension regions 140a and 140b including undercutting portions 141a and 141b, respectively, can be formed in first and then second extension implanting steps. In the first extension implanting step, the dopant ion beam (used to form the S/D extension regions 140a and 140b) is directed at the structure 100 at a non-vertical direction represented by an arrow 142a (or in short, the direction 142a). As a result, the S/D extension regions 140a and 140b are formed, but only the S/D extension region 140a extends under the gate region 130 as the undercutting portion 141a. Next, in the second extension implanting step, the dopant ion beam is directed at the structure 100 at a non-vertical direction 142b. As a result, the S/D extension region 140b extends under the gate region 130 as the undercutting portion 141b.

Figure 1C:
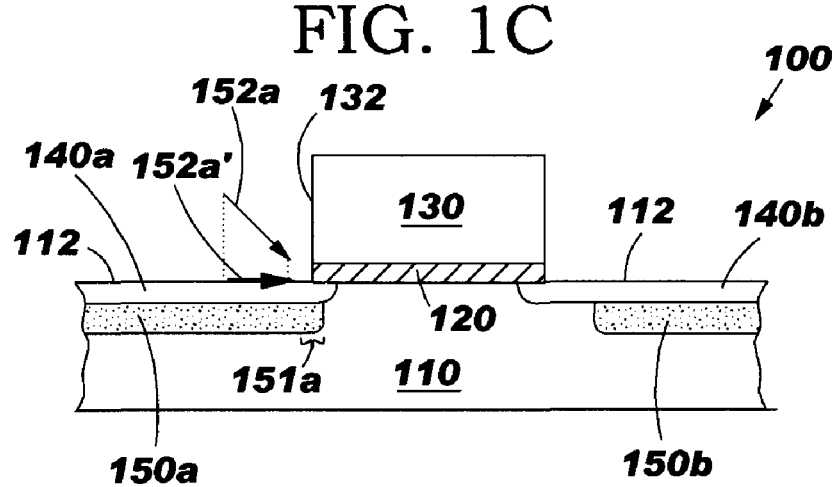
Figure 1D:
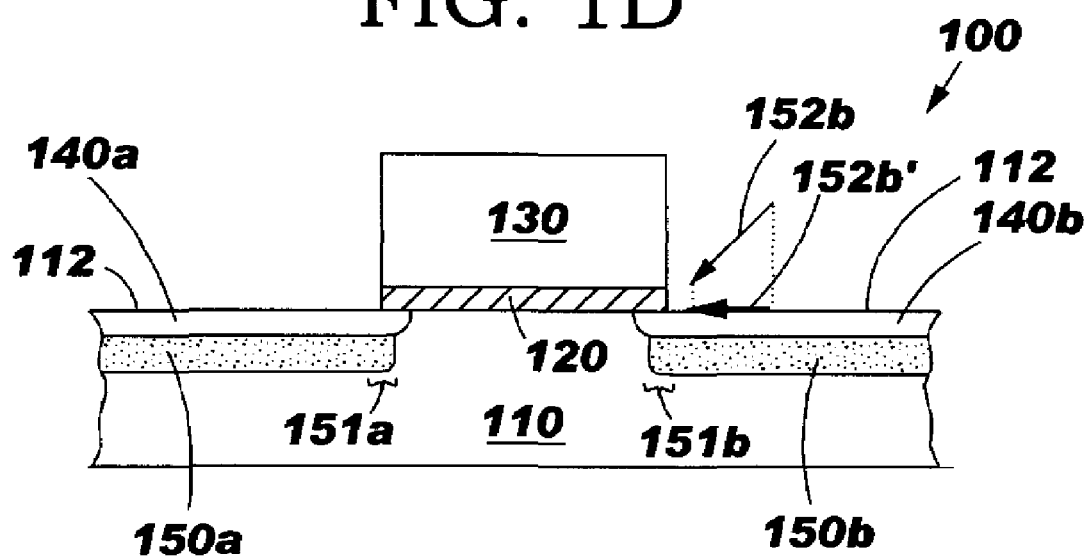

Next, with reference to FIGS. 1C and 1D, in one embodiment of the first halo implant method, halo regions 150a and 150b are formed beneath the S/D extension regions 140a and 140b, respectively. The halo regions 150a and 150b can be doped with dopants of opposite type to the dopants of the S/D extension regions 140a and 140b. For example, if the substrate 110 is of p-type and the S/D extension regions 140a and 140b are doped with n-type dopants, the halo regions 150a and 150b can be doped with p-type dopants (such as Boron). In one embodiment, the halo regions 150a and 150b can be formed by ion implantation with a dopant ion beam of Boron ions.

In one embodiment, the halo regions 150a and 150b extend under (i.e., undercut) the gate region 130 (FIG. 1D). More specifically, the halo regions 150a and 150b including undercutting portions 151a and 151b, respectively, can be formed in first and second halo implanting steps. In the first halo implanting step, with reference to FIG. 1C, the dopant ion beam (used to form the halo regions 150a and 150b) is directed at the structure 100 at a non-vertical direction 152a. As a result, the halo regions 150a and 150b are formed, but only the halo region 150a extends under the gate region 130 as the undercutting portion 151a. In the second halo implanting step, with reference to FIG. 1D, the dopant ion beam is directed at the structure 100 at a non-vertical direction 152b. As a result, the second halo region 150b extends under the gate region 130 as the undercutting portion 151b.

With reference back to FIG. 1C, in one embodiment, the direction 152a has a projected direction 152a' on a top surface 112 of the substrate 110, wherein the projected direction 152a' points from the S/D extension region 140a to the S/D extension region 140b and is essentially perpendicular to a direction of the gate region 130. The direction of the gate region 130 can be defined and represented by a vector (i.e., arrow) parallel to the interception line of the top surface 112 of the substrate 110 and a side wall 132 of the gate region 130. In FIG. 1C, the interception line (not shown) is perpendicular to the cross-sectional plane depicted in FIG. 1C. The direction of the gate region 130 can point into or point out of the cross-sectional plane depicted in FIG. 1C.

Similarly, with reference to FIG. 1D, in one embodiment, the direction 152b has a projected direction 152b' on the top surface 112 of the substrate 110, wherein the projected direction 152b' points from the S/D extension region 140b to the S/D extension region 140a and is essentially perpendicular to the direction of the gate region 130.

Figure 1E:
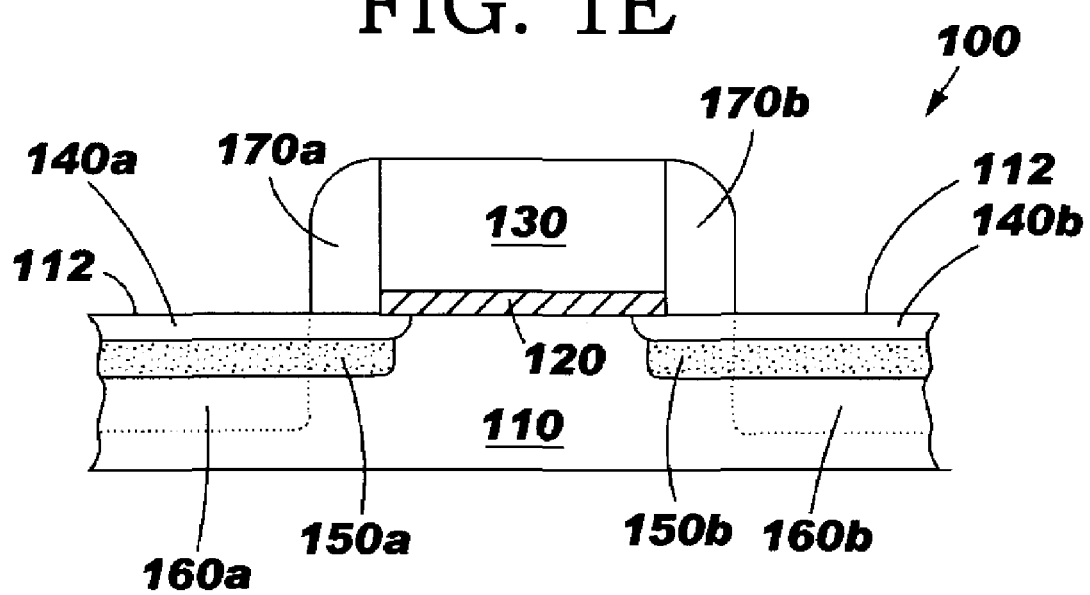

Next, with reference to FIG. 1E, in one embodiment, gate spacers 170a and 170b can be formed on side walls of the gate stack 130,120. In one embodiment, the gate spacers 170a and 170b comprise a nitride (e.g., silicon nitride). Next, the gate stack 130,120 and the gate spacers 170a and 170b are used as a mask for doping source/drain (S/D) regions 160a and 160b in and at top surface of the substrate 110. In one embodiment, the S/D region 160a can overlap with the S/D extension region 140a and the halo region 150a. Similarly, the S/D region 160b can overlap with the S/D extension region 140b and the halo region 150b.

The S/D regions 160a and 160b can be heavily doped with dopants of the same type as that of the S/D extension regions 140a and 140b. For example, if the S/D extension regions 140a and 140b are doped with n-type dopants, the S/D regions 160a and 160b can be heavily doped with n-type dopants (such as phosphorous). In one embodiment, the S/D regions 160a and 160b can be formed by ion implantation using a high-energy ion beam of dopants.

In one embodiment, multiple structures (not shown) similar to the structure 100 can be formed on a same wafer. Assume that the directions of the gate regions of these structures are parallel to each other (i.e., these structures have only one gate orientation). As a result, the first and second extension implanting steps and then the first and second halo implanting steps) can be performed only once (as described above) for all of these structures. Assume otherwise that these structures have two different gate orientations with some of the structures having a first gate orientation and the others having a second gate orientation. As a result, the first and second extension implanting steps and then the first and second halo implanting steps can be performed first for the structures having the first gate orientation. Then, the first and second extension implanting steps and then the first and second halo implanting steps can be performed one more time for the structures having the second gate orientation.

Figure 2A:
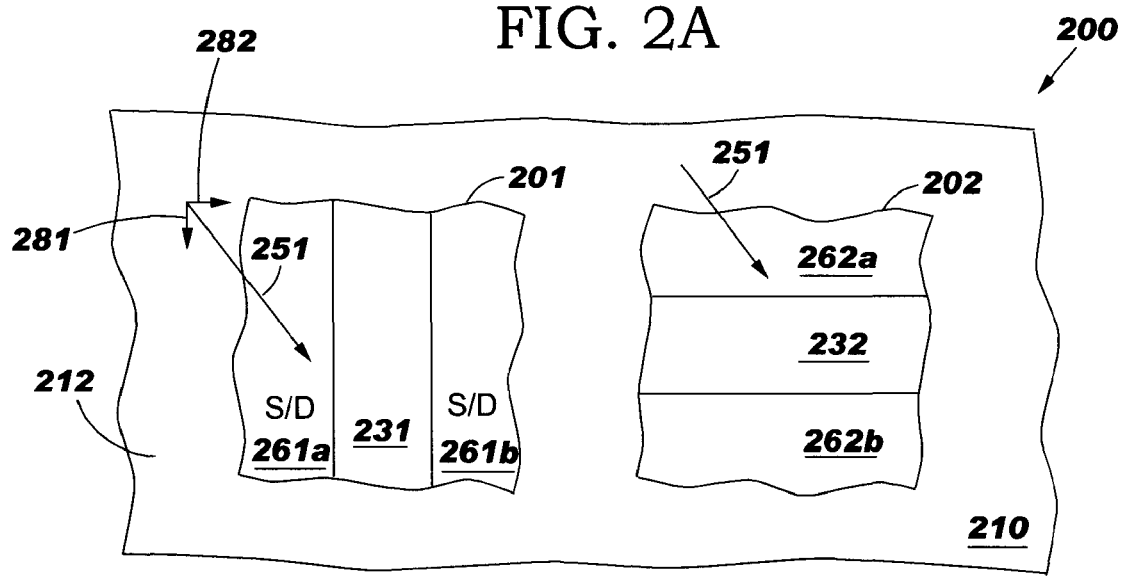
FIGS. 2A–2B show top views of another semiconductor structure used to illustrate a second halo implant method, in accordance with embodiments of the present invention.
Figure 2B:
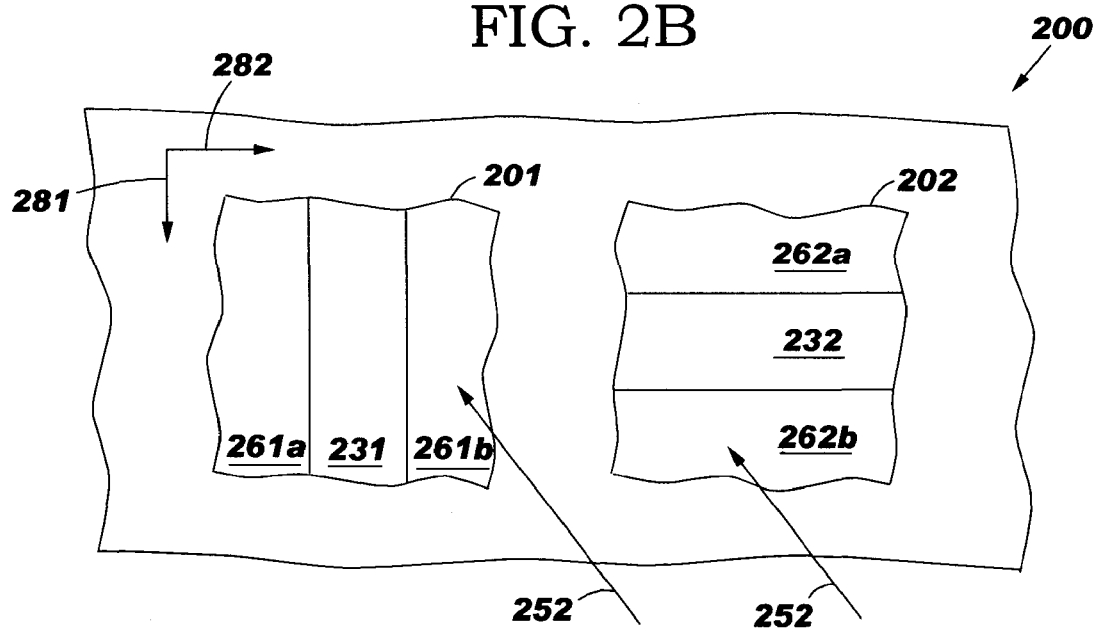

FIGS. 2A–2B show top views of a semiconductor structure 200 used to illustrate a second halo implant method, in accordance with embodiments of the present invention. The structure 200 comprises, illustratively, transistors 201 and 202 fabricated on a same semiconductor substrate 210. The transistor 201 comprises, illustratively, a gate region 231 formed on top of a channel region (not shown) which is sandwiched between two S/D regions 261a and 261b. Similarly, the transistor 202 comprises, illustratively, a gate region 232 formed on top of a channel region (not shown) which is sandwiched between two S/D regions 262a and 262b. In one embodiment, the transistors 201 and 202 are of a same channel polarity (e.g., n-type channel).

In one embodiment, the formation of each transistor of the transistors 201 and 202 (FIG. 2A) is similar to the formation of the structure 100 (FIG. 1E), except for the formation of the halo regions (not shown). In one embodiment, the second halo implant method comprises first and second halo ion bombardments (i.e., halo ion beams).

In one embodiment, with reference to FIG. 2A, the first halo ion bombardment of the second halo implant method has a projected direction 251 (i.e., the first halo ion bombardment of the second halo implant method has a direction whose projected direction on the top surface 212 of the substrate 210 is the projected direction 251). In one embodiment, the projected direction 251 is essentially a bisector direction of a direction 281 of the gate region 231 and a direction 282 of the gate region 232.

Next, with reference to FIG. 2B, the second halo ion bombardment of the second halo implant method has a projected direction 252 which is essentially opposite to the projected direction 251 (FIG. 2A). For instance, if the projected direction 251 (FIG. 2A) is Northwest-Southeast, the projected direction 252 can be Southeast-Northwest as shown. As a result, after the first and second halo ion bombardments of the second halo implant method, all the resulting halo regions (not shown) of both transistors 201 and 202 have the desired undercutting portions under the respective gate regions 231 and 232.

In one embodiment, the directions 281 and 282 are perpendicular to each other. Assume that the direction 281 is North-South and the direction 282 is West-East. As a result, the projected direction 251 (FIG. 2A), as a bisector direction of the directions 281 and 282, can be essentially Northwest-Southeast, whereas the projected direction 252 (FIG. 2B) can be essentially Southeast-Northwest as shown.

FIGS. 3A–3D show top views of the semiconductor structure 200 of FIGS. 2A–2B used to illustrate a third halo implant method, in accordance with embodiments of the present invention. More specifically, in one embodiment, the third halo implant method comprises four (first, second, third, and fourth) halo ion bombardments.

Figure 3A:
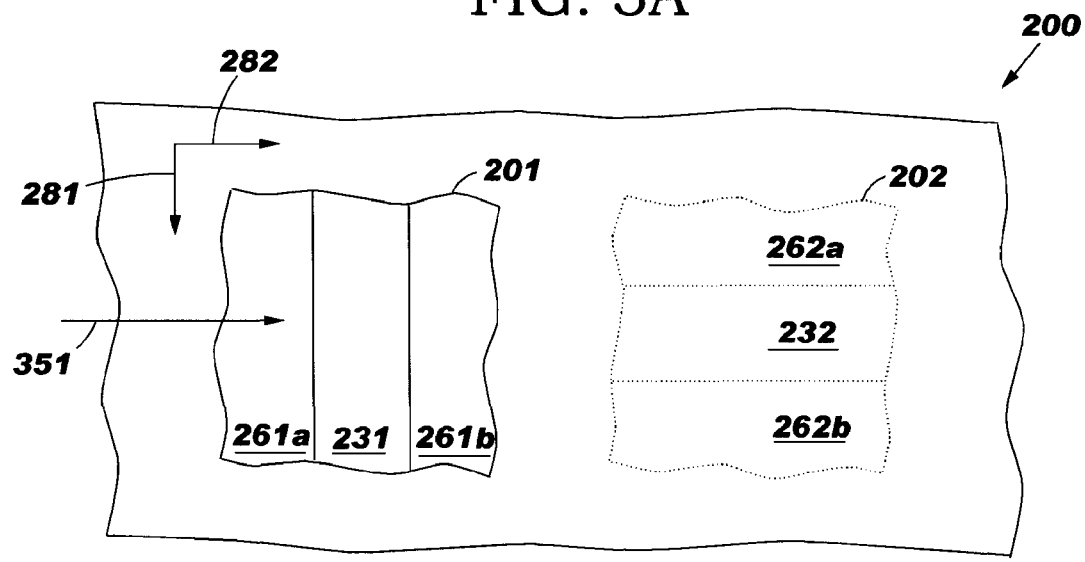

In one embodiment, with reference to FIG. 3A, the first halo ion bombardment of the third halo implant method has a projected direction 351 which is essentially perpendicular to the direction 281 of the gate region 231 and going from the S/D region 261a towards the gate region 231. In one embodiment, the first halo ion bombardment of the third halo implant method is performed while the transistor 202 is covered by a first mask (not shown) so that the transistor 202 is not affected by the first halo ion bombardment of the third halo implant method.

Figure 3B:
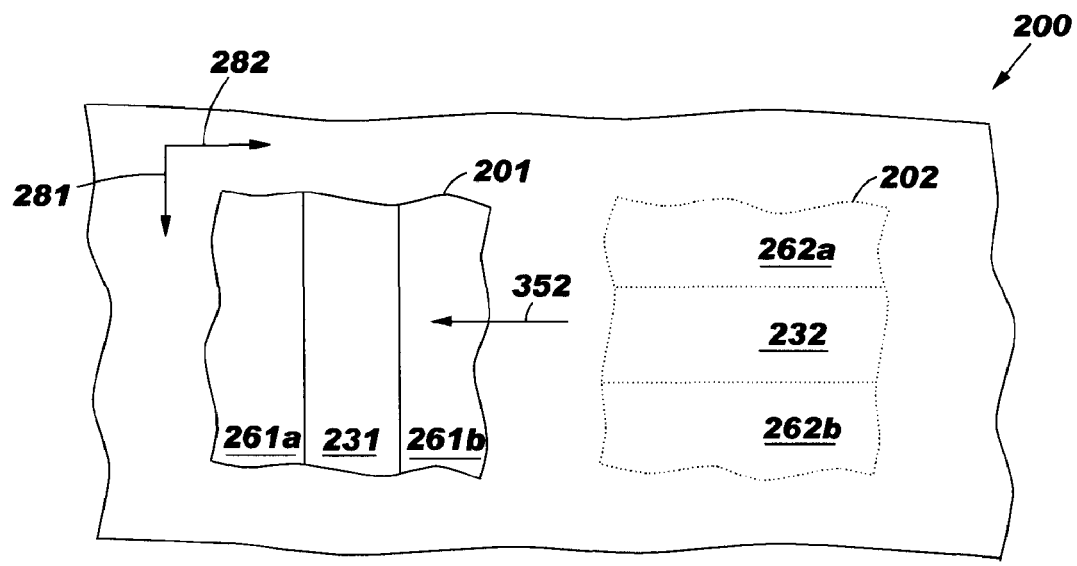

Next, in one embodiment, with reference to FIG. 3B, the second halo ion bombardment of the third halo implant method has a projected direction 352 which is essentially perpendicular to the direction 281 of the gate region 231 and going from the S/D region 261b towards the gate region 231. In one embodiment, the first halo ion bombardment of the third halo implant method is performed while the transistor 202 is still covered by the first mask.

Next, in one embodiment, with reference to FIG. 3C, the third halo ion bombardment of the third halo implant method has a projected direction 353 which is essentially perpendicular to the direction 282 of the gate region 232 and going from the S/D region 262a towards the gate region 232. In one embodiment, the third halo ion bombardment of the third halo implant method is performed while the transistor 201 is covered by a second mask (not shown) so that the transistor 201 is not affected by the third halo ion bombardment of the third halo implant method (in one embodiment, the first mask is removed before the second mask is put in place).

Next, in one embodiment, with reference to FIG. 3D, the fourth halo ion bombardment of the third halo implant method has a projected direction 354 which is essentially perpendicular to the direction 282 of the gate region 232 and going from the S/D region 262b towards the gate region 232. In one embodiment, the fourth halo ion bombardment of the third halo implant method is performed while the transistor 201 is still covered by the second mask.

In one embodiment, the directions 281 and 282 in FIGS. 3A–3D are perpendicular to each other. Assume that the direction 281 is North-South and the direction 282 is West-East. As a result, the projected directions 351 (FIG. 3A), 352 (FIG. 3B), 353 (FIG. 3C), 354 (FIG. 3D) can be essentially West-East, East-West, North-South, and South-North, respectively.

FIGS. 4A–4D show top views of the semiconductor structure 200 of FIGS. 2A–2B used to illustrate a fourth halo implant method, in accordance with embodiments of the present invention. More specifically, in one embodiment, the fourth halo implant method comprises four (first, second, third, and fourth) halo ion bombardments.

Figure 4A:
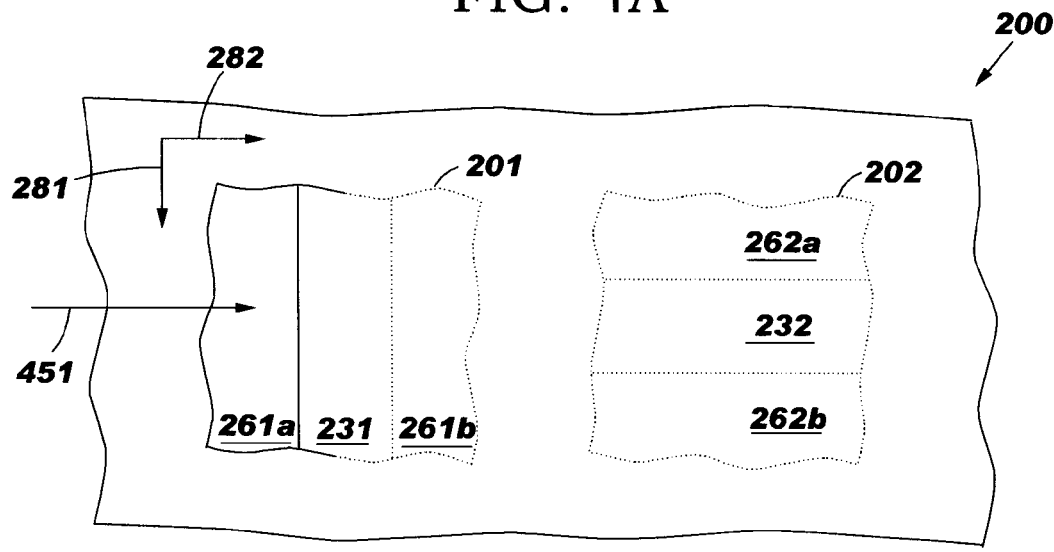
FIGS. 4A–4D show top views of the semiconductor structure of FIGS. 2A–2B used to illustrate a fourth halo implant method, in accordance with embodiments of the present invention.

In one embodiment, with reference to FIG. 4A, the first halo ion bombardment of the fourth halo implant method has a projected direction 451 which is essentially perpendicular to the direction 281 of the gate region 231 and going from the S/D region 261a towards the gate region 231. In one embodiment, the first halo ion bombardment of the fourth halo implant method is performed while the transistor 202 and essentially a half of the transistor 201 corresponding to the side of the S/D region 261b are covered by a third mask (not shown) so that the transistor 202 and the half of the transistor 201 corresponding to the side of the S/D region 261b are not affected by the first halo ion bombardment of the fourth halo implant method.

Figure 4B:
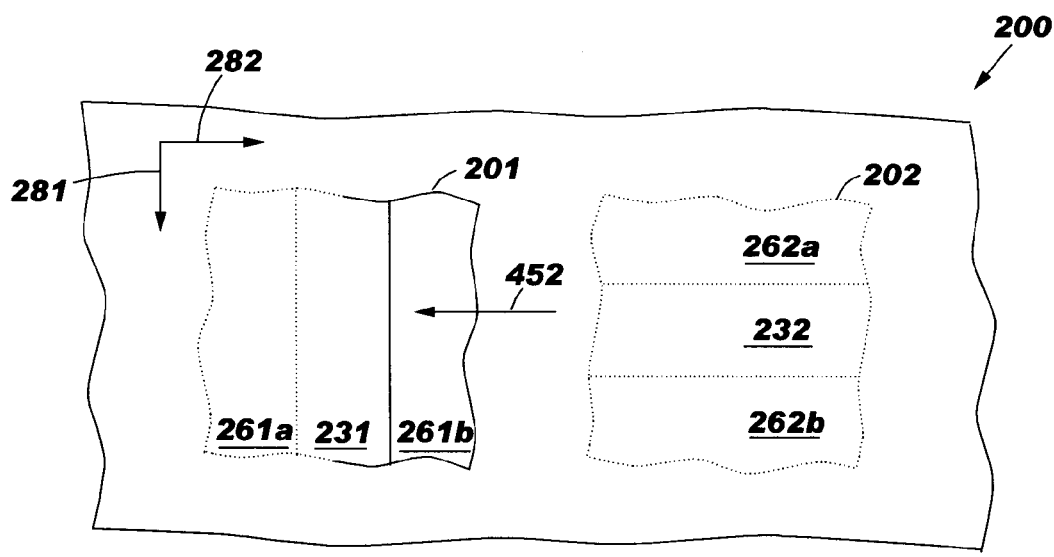

Next, in one embodiment, with reference to FIG. 4B, the second halo ion bombardment of the fourth halo implant method has a projected direction 452 which is essentially perpendicular to the direction 281 of the gate region 231 and going from the S/D region 261b towards the gate region 231. In one embodiment, the first halo ion bombardment of the fourth halo implant method is performed while the transistor 202 and essentially a half of the transistor 201 corresponding to the side of the S/D region 261a are covered by a fourth mask (not shown) so that the transistor 202 and the half of the transistor 201 corresponding to the side of the S/D region 261a are not affected by the second halo ion bombardment of the fourth halo implant method (in one embodiment, the third mask is removed before the fourth mask is put in place).

Figure 4C:
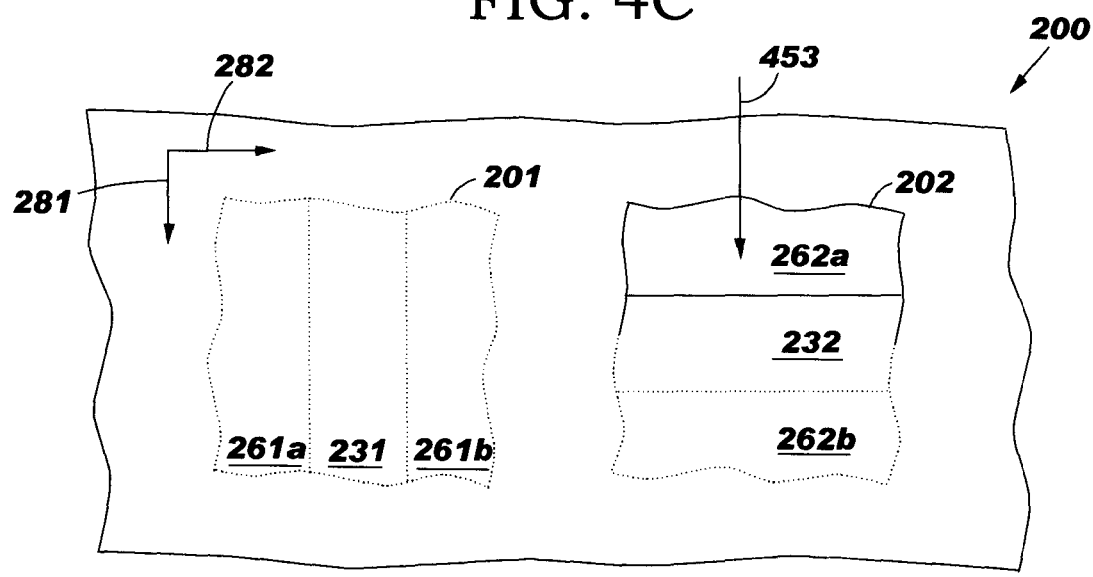

Next, in one embodiment, with reference to FIG. 4C, the third halo ion bombardment of the fourth halo implant method has a projected direction 453 which is essentially perpendicular to the direction 282 of the gate region 232 and going from the S/D region 262a towards the gate region 232. In one embodiment, the third halo ion bombardment of the fourth halo implant method is performed while the transistor 201 and essentially a half of the transistor 202 corresponding to the side of the S/D region 262b are covered by a fifth mask (not shown) so that the transistor 201 and the half of the transistor 202 corresponding to the side of the S/D region 262b are not affected by the third halo ion bombardment of the fourth halo implant method (in one embodiment, the fourth mask is removed before the fifth mask is put in place).

Figure 4D:
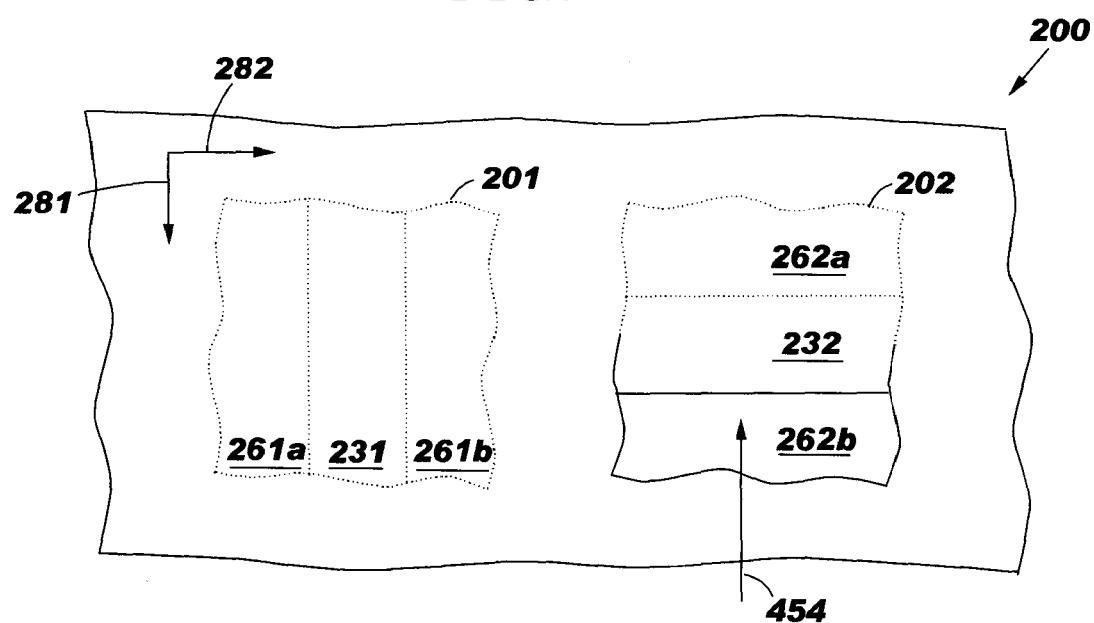

Next, in one embodiment, with reference to FIG. 4D, the fourth halo ion bombardment of the fourth halo implant method has a projected direction 454 which is essentially perpendicular to the direction 282 of the gate region 232 and going from the S/D region 262b towards the gate region 232. In one embodiment, the fourth halo ion bombardment of the fourth halo implant method is performed while the transistor 201 and essentially a half of the transistor 202 corresponding to the side of the S/D region 262a are covered by a sixth mask (not shown) so that the transistor 201 and the half of the transistor 202 corresponding to the side of the S/D region 262a are not affected by the fourth halo ion bombardment of the fourth halo implant method (in one embodiment, the fifth mask is removed before the sixth mask is put in place).

In one embodiment, the directions 281 and 282 in FIGS. 4A–4D are perpendicular to each other. Assume that the direction 281 is North-South and the direction 282 is West-East. As a result, the projected directions 451 (FIG. 4A), 452 (FIG. 4B), 453 (FIG. 4C), 454 (FIG. 4D) can be essentially West-East, East-West, North-South, and South-North, respectively, as shown.

With reference back to FIG. 4A, the third mask is shown to cover the entire transistor 202, the entire S/D region 261b, and a right portion of the gate region 231. Alternatively, due to mask fabrication tolerance, the third mask can cover the entire transistor 202 and a right portion of the S/D region 261b, leaving the entire S/D region 261a, the entire gate region 231, and a left potion of the S/D region 261b exposed to halo bombardment. In This case may be acceptable, but the width of the exposed left portion of the S/D region 261b (measured in a direction perpendicular to the direction of the gate region 231) should be kept as small as possible to minimize unwanted halo implants in the S/D region 261b as a result of the halo bombardment in the projected direction 451. The optimum case is shown in FIG. 4A where the third mask covers the entire S/D region 261b. Similar considerations are applicable to the fourth, fifth, and sixth masks.

In summary, in each of the second and third halo implant methods of the present invention (described supra with reference to FIGS. 2A–2D, and 3A–3D), each of the S/D regions 261a, 261b, 262a, and 262b is subjected to only two halo ion bombardments. Especially, in the fourth halo implant method of the present invention (described supra with reference to FIGS. 4A–4D), each of the S/D regions 261a, 261b, 262a, and 262b is subjected to only one halo ion bombardments.

In the embodiments described above with reference to FIGS. 2 and 3, the structure 200 have two transistors 201 and 202 having two respective gate orientations. Alternatively, the structure 200 can have two or more transistors similar to the transistors 201 and 202 but having only one gate orientation. As a result, the number of masks and halo implanting steps can be reduced.

More specifically, with reference to FIGS. 3A–3D, assume that the two transistors 201 and 202 have the same gate orientation (e.g., both the gate regions 231 and 232 run in the North-South direction). As a result, the first and second masks are not needed for the third halo implant method. Also, only the first and second halo ion bombardments in the projected directions 351 and 352, respectively, are needed (the third and fourth halo ion bombardments in the projected directions 353 and 354 are not needed).

With reference to FIGS. 4A–4D, assume that the two transistors 201 and 202 have the same gate orientation (e.g., both the gate regions 231 and 232 run in the North-South direction). As a result, only two masks (seventh and eighth) masks are needed, as opposed to four masks (third, fourth, fifth, and sixth masks) needed in the above embodiments. The seventh mask can cover the two right S/D regions of the transistors 201 and 202 while the two left S/D regions of the transistors 201 and 202 are subjected to the halo ion bombardment in projected direction 451 (FIG. 4A). Then, the seventh mask can be removed and the eighth mask can cover the two left S/D regions of the transistors 201 and 202 while the two right S/D regions of the transistors 201 and 202 are subjected to the halo ion bombardment in projected direction 452 (FIG. 4B). In total, only two halo ion bombardments in the projected directions 452 and 453 (FIGS. 4A and 4B, respectively) are needed instead of four as described above with reference to FIGS. 4A–4D.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A halo implant method, comprising the steps of:
(a) providing first and second semiconductor structures formed on a same semiconductor substrate,
wherein the first semiconductor structure comprises a first gate region, a first channel region, and first and second semiconductor regions,
wherein the first gate region is on top of the first channel region and is oriented in a first direction,
wherein the first channel region is sandwiched between the first and second semiconductor regions,
wherein the second semiconductor structure comprises a second gate region,
a second channel region, and third and fourth semiconductor regions,
wherein the second gate region is on top of the second channel region and is oriented in a second direction,
wherein the second channel region is sandwiched between the third and fourth semiconductor regions, and
wherein the first and second channel regions are of a same channel polarity,
wherein the first and second directions are essentially parallel to a top surface of the semiconductor substrate and are not parallel to each other; and
(b) halo-implanting the first, second, third, and fourth semiconductor regions in a third projected direction, wherein the third projected direction is essentially a bisector direction of the first and second directions.

2. The method of claim 1, further comprising the step of halo-implanting the first, second, third, and fourth semiconductor regions in a fourth projected direction, wherein the fourth projected direction is essentially opposite to the third projected direction.

3. The method of claim 1, wherein the first direction is essentially perpendicular to the second direction.

4. The method of claim 1, wherein the substrate is p-doped and the step of halo-implanting the first, second, third, and fourth semiconductor regions in the third and fourth projected directions comprises p-type dopant implantation.

5. A halo implant method, comprising the steps of:
(a) providing first and second semiconductor structures formed on a same semiconductor substrate,
wherein the first semiconductor structure comprises a first gate region, a first channel region, and first and second semiconductor regions,
wherein the first gate region is on top of the first channel region and is oriented in a first direction,
wherein the first channel region is sandwiched between the first and second semiconductor regions, wherein the second semiconductor structure comprises a second gate region, a second channel region, and third and fourth semiconductor regions, wherein the second gate region is on top of the second channel region and is oriented in a second direction, wherein the second channel region is sandwiched between the third and fourth semiconductor regions, wherein the first and second channel regions are of a same channel polarity, wherein the first and second directions are essentially parallel to a top surface of the semiconductor substrate; and (b) if the first and second directions are not essentially parallel to each other, halo-implanting the first semiconductor region, but not the third and fourth semiconductor regions, in a third projected direction, wherein the third projected direction is essentially perpendicular to the first direction and going from the first semiconductor region toward the first gate region; and (c) if the first and second directions are essentially parallel to each other, halo-implanting the first and third semiconductor regions, but not the second and fourth semiconductor regions, in a fourth projected direction, wherein the fourth projected direction is essentially perpendicular to the first direction and going from the first semiconductor region toward the first gate region.

6. The method of claim 5, wherein step (b) also halo-implants the second semiconductor region.

7. The method of claim 6, further comprising the step of, if the first and second directions are not essentially parallel to each other, halo-implanting the first and second semiconductor regions, but not the third and fourth semiconductor regions, in a fourth projected direction, wherein the fourth projected direction is essentially perpendicular to the first direction and going from the second semiconductor region toward the first gate region.

8. The method of claim 7, further comprising the step of, if the first and second directions are not essentially parallel to each other, halo-implanting the third and fourth semiconductor regions, but not the first and second semiconductor regions, in a fifth projected direction, wherein the fifth projected direction is essentially perpendicular to the second direction and going from the third semiconductor region toward the second gate region.

9. The method of claim 8, further comprising the step of, if the first and second directions are not essentially parallel to each other, halo-implanting the third and fourth semiconductor regions, but not the first and second semiconductor regions, in a sixth projected direction, wherein the sixth projected direction is essentially perpendicular to the second direction and going from the fourth semiconductor region toward the second gate region.

10. The method of claim 9, wherein the first direction is essentially perpendicular to the second direction.

11. The method of claim 5, wherein step (b) essentially does not halo-implant the second semiconductor region.

12. The method of claim 11, further comprising the step of, if the first and second directions are not essentially parallel to each other, halo-implanting the second semiconductor regions, but essentially not the first, third, and fourth semiconductor regions, in a fourth projected direction, wherein the fourth projected direction is essentially perpendicular to the first direction and going from the second semiconductor region toward the first gate region.

13. The method of claim 12, further comprising the step of, if the first and second directions are not essentially parallel to each other, halo-implanting the third semiconductor region, but essentially not the first, second, and fourth semiconductor regions, in a fifth projected direction, wherein the fifth projected direction is essentially perpendicular to the second direction and going from the third semiconductor region toward the second gate region.

14. The method of claim 13, further comprising the step of, if the first and second directions are not essentially parallel to each other, halo-implanting the fourth semiconductor region, but essentially not the first, second, and third semiconductor regions, in a sixth projected direction, wherein the sixth projected direction is essentially perpendicular to the second direction and going from the fourth semiconductor region toward the second gate region.

15. A semiconductor structure, comprising:

(a) first and second semiconductor structures formed on a same semiconductor substrate, wherein the first semiconductor structure comprises a first gate region, a first channel region, and first and second semiconductor regions, wherein the first gate region is on top of the first channel region and is oriented in a first direction, wherein the first channel region is sandwiched between the first and second semiconductor regions, wherein the second semiconductor structure comprises a second gate region, a second channel region, and third and fourth semiconductor regions, wherein the second gate region is on top of the second channel region and is oriented in a second direction, wherein the second channel region is sandwiched between the third and fourth semiconductor regions, wherein the first and second channel regions are of a same channel polarity, wherein the first and second directions are essentially parallel to a top surface of the semiconductor substrate and are not parallel to each other; and (b) a halo ion beam having a projected direction which is essentially a bisector direction of the first and second directions.

16. The semiconductor structure of claim 15, wherein the first semiconductor region, but not the third and fourth semiconductor regions, is in a path of the halo ion beam.

17. The semiconductor structure of claim 16, further comprising a mask formed on top of the third and fourth semiconductor regions, wherein the mask essentially blocks the halo ion beam from the third and fourth semiconductor regions.

18. The semiconductor structure of claim 16, wherein the second semiconductor region is in a path of the halo ion beam.

19. The semiconductor structure of claim 16, wherein the second semiconductor region is not in a path of the halo ion beam.

20. The semiconductor structure of claim 15, wherein the first direction is essentially perpendicular to the second direction.

* * * * *